(12) United States Patent
Mukherjee et al.

(10) Patent No.: US 8,415,751 B2
(45) Date of Patent: Apr. 9, 2013

(54) METHOD TO REDUCE CONTACT RESISTANCE OF N-CHANNEL TRANSISTORS BY USING A III-V SEMICONDUCTOR INTERLAYER IN SOURCE AND DRAIN

(75) Inventors: Niloy Mukherjee, Beaverton, OR (US); Gilbert Dewey, Hillsboro, OR (US); Marko Radosavljevic, Beaverton, OR (US); Robert S. Chau, Hillsboro, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 157 days.

(21) Appl. No.: 12/982,083

(22) Filed: Dec. 30, 2010

(65) Prior Publication Data

US 2012/0168877 A1  Jul. 5, 2012

(51) Int. Cl.
*H01L 29/78* (2006.01)
*H01L 21/205* (2006.01)
*H01L 21/203* (2006.01)

(52) U.S. Cl.
USPC ............ 257/401; 257/E29.264; 257/E21.097; 257/E21.109

(58) Field of Classification Search .................. 438/492; 257/401, E29.264, E21.097, E21.109
See application file for complete search history.

(56) References Cited

U.S. PATENT DOCUMENTS

| 6,610,576 | B2 | 8/2003 | Nowak |
| 7,875,931 | B2 * | 1/2011 | Yamazaki et al. ............ 257/347 |
| 2008/0124878 | A1 | 5/2008 | Cook et al. |
| 2010/0155846 | A1 | 6/2010 | Mukherjee et al. |
| 2010/0163926 | A1 | 7/2010 | Hudait et al. |

FOREIGN PATENT DOCUMENTS

| WO | 2012/092038 A2 | 7/2012 |
| WO | 2012/092038 A3 | 11/2012 |

OTHER PUBLICATIONS

International Search Report and Written Opinion Received for PCT Patent Application No. PCT/US2011/065943 mailed on Aug. 30, 2012, 9 pages.

\* cited by examiner

*Primary Examiner* — Calvin Lee
*Assistant Examiner* — Monica D Harrison
(74) *Attorney, Agent, or Firm* — David L. Guglielmi

(57) ABSTRACT

A method to reduce contact resistance of n-channel transistors by using a III-V semiconductor interlayer in source and drain is generally presented. In this regard, a device is introduced comprising an n-type transistor with a source region and a drain region a first interlayer dielectric layer adjacent the transistor, a trench through the first interlayer dielectric layer to the source region, and a conductive source contact in the trench, the source contact being separated from the source region by a III-V semiconductor interlayer. Other embodiments are also disclosed and claimed.

19 Claims, 14 Drawing Sheets

US 8,415,751 B2

METHOD TO REDUCE CONTACT RESISTANCE OF N-CHANNEL TRANSISTORS BY USING A III-V SEMICONDUCTOR INTERLAYER IN SOURCE AND DRAIN

BACKGROUND

Background of the Invention

In the manufacture of integrated circuits, devices such as transistors are formed on a wafer and connected together using multiple metallization layers. The metallization layers include vias and interconnects, as are well known in the art, that function as electrical pathways to interconnect the devices. Contacts connect the vias and interconnects to the devices.

DETAILED DESCRIPTION

Various embodiments of a contact to a semiconductor device with a III-V semiconductor layer separating a conductive contact from the device are discussed in the following description. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative example representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order, in series or in parallel, than the described embodiment. Various additional operations may be performed and/or described. Operations may be omitted in additional embodiments.

Figure 1:
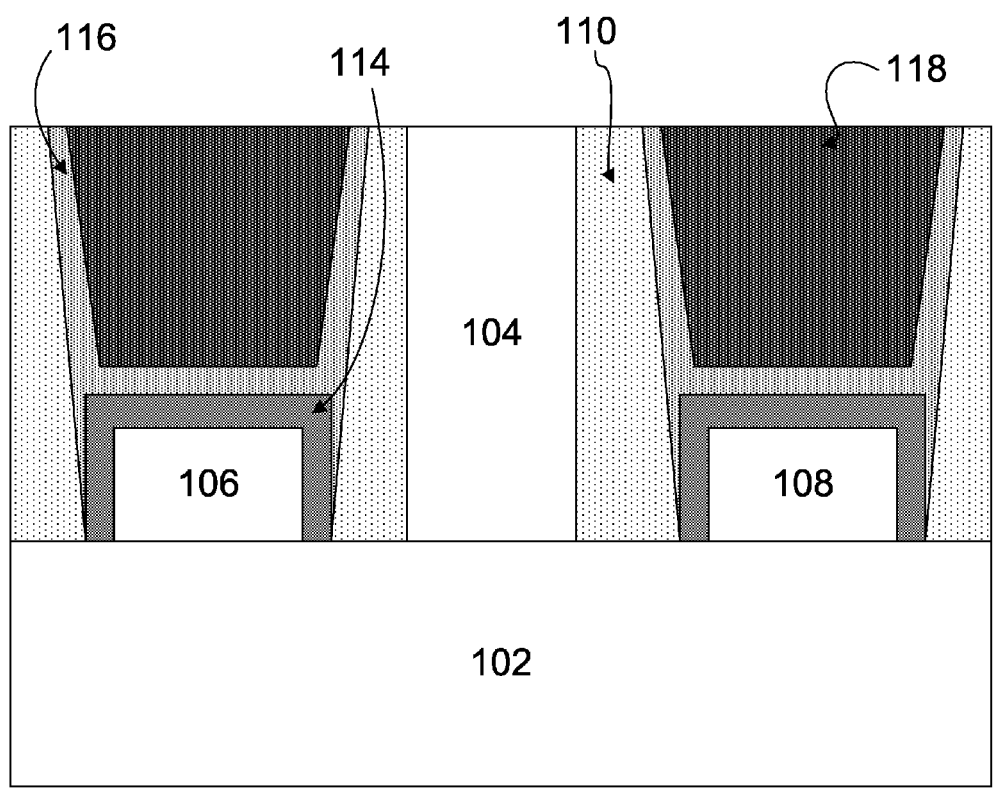
FIG. 1 is a cross sectional side view that illustrates a device having an electrical contact where the conductive contact material is separated by a III-V semiconductor layer from the region being contacted.

FIG. 1 is a cross sectional side view that illustrates a device 100 having an electrical contact where the conductive contact material 116 is separated by III-V semiconductor layer 114 from regions 106 and 108. In an embodiment, the device 100 is a transistor. The transistor includes a source region 106 and a drain region 108. There are contacts to the source and drain regions 106, 108. These contacts include a conductive material 116 that is separated from the source and drain regions 106, 108 by III-V semiconductor material 114. Such an arrangement can produce improved current flow in silicon and germanium n-channel transistors, particularly when the III-V semiconductor material 114 is chosen and/or doped for a relatively low bandgap and high electron mobility.

By utilizing III-V semiconductor material 114 between conductive material 116 and source and drain regions 106 and 108, device 100 may scale better to smaller dimensions by lowering the Schottky Barrier Height without significantly increasing series resistance. Some examples for III-V semiconductor material 114 include, but are not limited to InAs, InGaAs, InSb, GaSb, and GaInAsSbP. Other III-V semiconductor materials may be chosen and in some embodiments III-V semiconductor material 114 is doped for greater electron conductivity.

In the illustrated example, the device 100 includes a substrate 102. This substrate 102 may comprise any material that may serve as a foundation upon which a semiconductor device may be built. In one example, substrate 102 is a silicon containing substrate, although other materials, for example other Groups IV materials, may be used in other examples. The substrate 102 may be formed using a bulk silicon or a silicon-on-insulator substructure. In other implementations, the substrate 102 may be formed using alternate materials, which may or may not be combined with silicon, that include but are not limited to germanium, indium gallium arsenide, indium antimonide, lead telluride, indium arsenide, indium phosphide, gallium arsenide, gallium antimonide, gallium nitride, or other Group III-V materials. The substrate 102 may be a single material, or have multiple layers and/or have multiple structures. Although a few examples of materials from which the substrate 102 may be formed are described here, any material that may serve as a foundation upon which a device may be built falls within the spirit and scope of the present invention. An n-type channel region may be enhanced within substrate 102 through doping.

The device 100 in the illustrated example includes a transistor. The transistor includes a gate 104, a source region 106, and a drain region 108. The transistor may include several other regions and structures, but these are omitted for the sake of simplicity and clarity. While illustrated as a raised source/drain transistor the transistor may be planar, may be a multi-gate transistor, may be on different types of materials, etc.; the contacts described herein are not limited to a particular type of device 100 or transistor. Source region 106 and drain region 108 may be formed by depositing Group IV material on a surface of substrate 102 and may be doped. Although shown as being rectangular in shape source region 106 and drain region 108 may be other shapes.

There is a first interlayer dielectric (ILD) layer 110 on the transistor in the illustrated example. Contacts to the source region 106 and the drain region 108 are formed in trenches through the first ILD layer 110. Note that for clarity, contacts to the gate 104 are not shown herein, but would normally be present. Contacts to the gate 104 similar to illustrated and described contacts to source and drain regions 106, 108 may be used in various embodiments. The contacts described herein are not limited to use for source and drain regions 106, 108, but can be used with the gate 104 or other components. The contacts allow operation of the transistor, and electrical communication between various transistors, and between the device 100 and external devices.

The contact includes an III-V semiconductor layer 114 that is adjacent the source and drain regions 106, 108 in the illustrated embodiment. Adjacent the III-V semiconductor layer 114 is a conducting layer 116. The III-V semiconductor layer 114 separates the conducting layer 116 from the source and drain regions 106, 108 (or from whatever component the contact is for). While the conducting layer 116 is not in direct contact with the source and drain regions 106, 108, it still functions as an electrical contact. This type of contact may also allow the tuning of the Schottky barrier height and contact resistance as desired for optimal device 100 performance.

In the illustrated embodiment, there is a fill material 118 that substantially fills the rest of the volume of the trench through the first ILD layer 110 not taken up by the III-V semiconductor layer 114 and conductor layer 116. The fill material 118 may be a metal or other conductor, or may be another type of material. In some embodiments, there is not a separate fill material 118. Rather, the conductor layer 116 may substantially fill the rest of the volume of the trench through the first ILD layer 110 not taken up by the III-V semiconductor layer 114.

Figure 2:
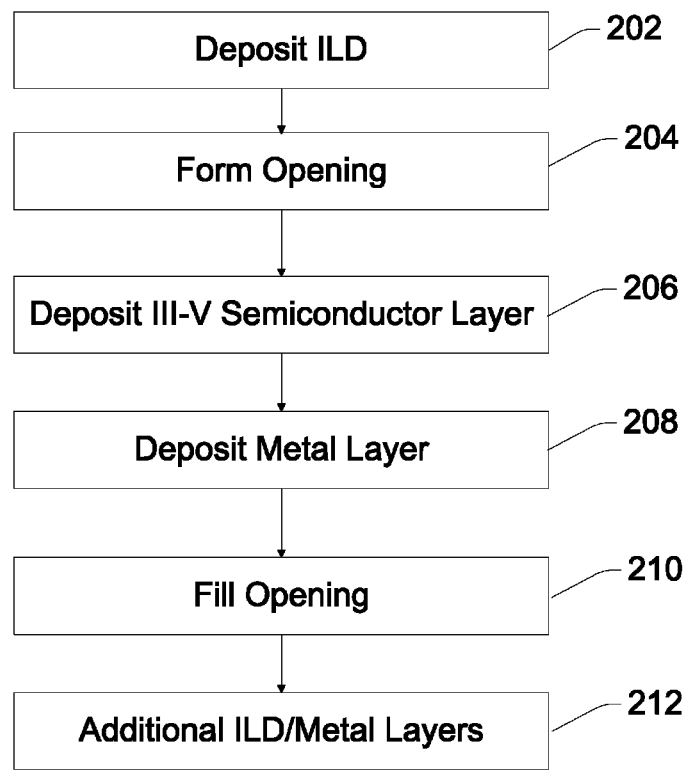
FIG. 2 is a flow chart that illustrates one method by which the device shown in FIG. 1 may be fabricated.

FIG. 2 is a flow chart 200 that illustrates one method by which the device 100 shown in FIG. 1 may be fabricated. Other methods are possible in other embodiments. At the start of this example method, the transistor, including the gate 104, source 106, and drain 108, has been formed on the substrate 102. The first ILD layer 110 is deposited 202 on the transistor.

Figure 3:
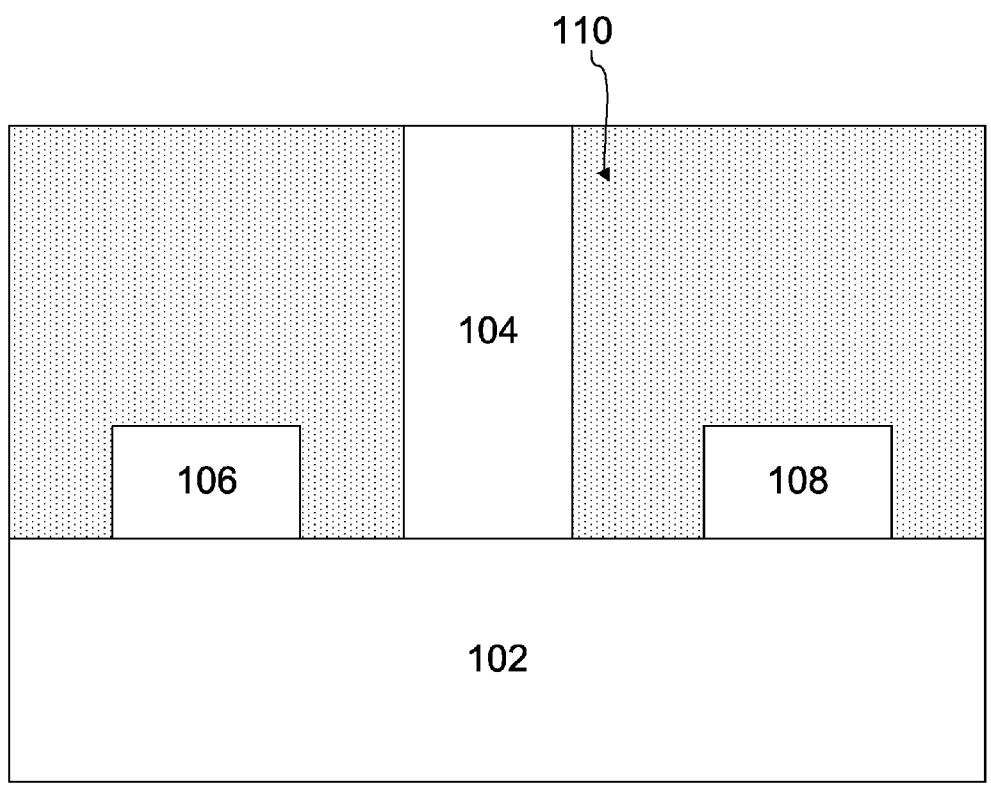
FIG. 3 is a cross sectional side view that illustrates the first ILD layer deposited on the transistor.

FIG. 3 is a cross sectional side view that illustrates the first ILD layer 110 deposited 202 on the transistor, according to one embodiment of the present invention. The first ILD layer 110 may be formed using materials known for the applicability in dielectric layers for integrated circuit structures, such as low-k dielectric materials. Such dielectric materials include, but are not limited to, oxides such as silicon dioxide (SiO2) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric first ILD layer 110 may include pores or other voids to further reduce its dielectric constant.

Figure 4:
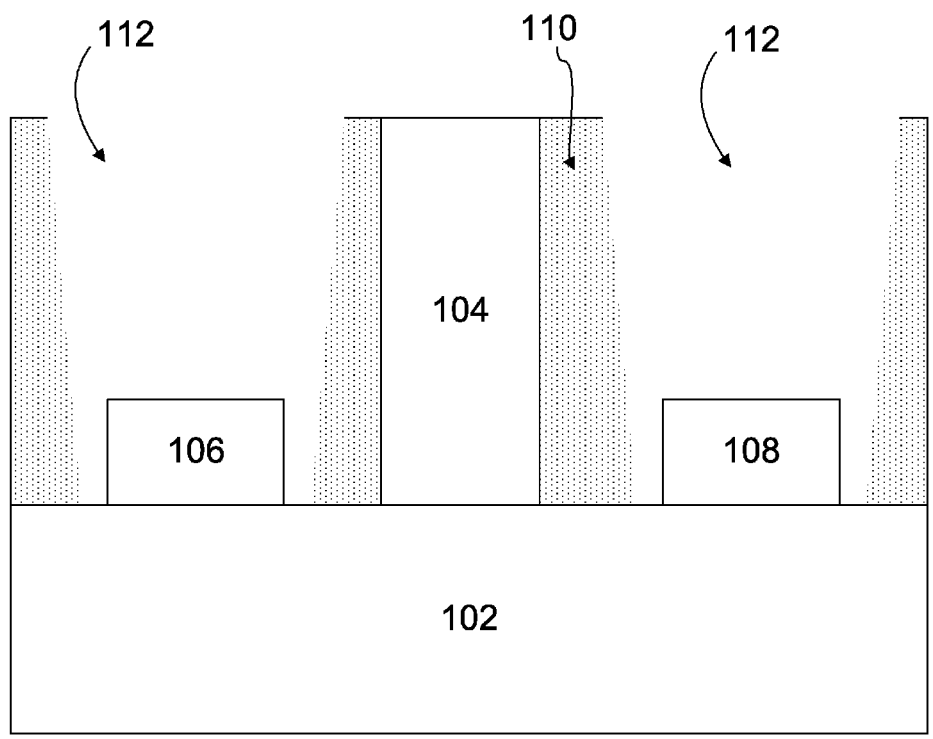
FIG. 4 is a cross sectional side view that illustrates trenches formed in the first ILD layer.

Returning to FIG. 2, an opening is formed 204 in the first ILD layer 110. FIG. 4 is a cross sectional side view that illustrates trenches 112 formed 204 in the first ILD layer 110. Any suitable method, such as one or more wet or dry etches may be used to form 204 the trenches 112. As illustrated, the trenches 112 are only to the source and drain regions 106, 108. However, trenches 112 and contacts to the gate 104 may also be formed although they are not specifically shown and described herein.

Figure 5:
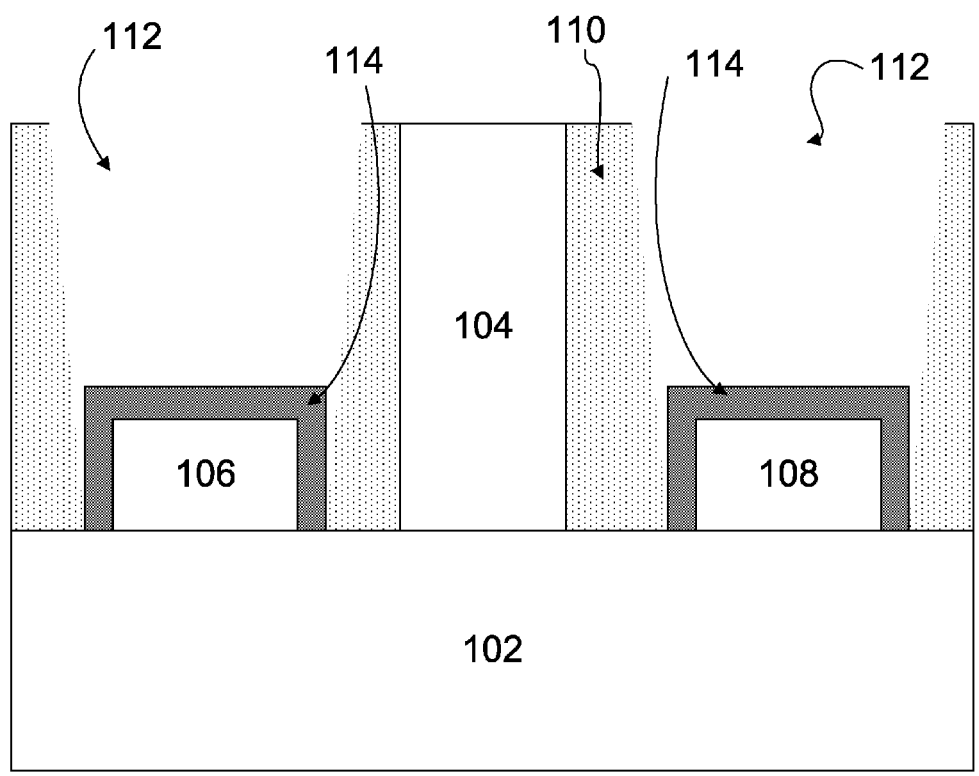
FIG. 5 is a cross sectional side view that illustrates the III-V semiconductor layer deposited in the trenches.

As shown in FIG. 2, after the trenches 112 are formed 204, an III-V semiconductor layer 114 may be deposited 206 in the trenches 112. FIG. 5 is a cross sectional side view that illustrates the III-V semiconductor layer 114 deposited 206 in the trenches 112. In some embodiments, the III-V semiconductor layer 114 may be formed 206 by Metallorganic Vapor Phase Epitaxy (MOVPE), Metallorganic Chemical Vapor Deposition (MOCVD), Molecular Beam Epitaxy (MBE), Metallorganic Molecular Beam Epitaxy (MOMBE), Migration Enhanced Molecular Beam Epitaxy (MEE-MBE), Atomic Layer Epitaxy (ALE), Atomic Layer Deposition (ALD), and Physical Vapor Deposition (PVD). III-V semiconductor layer 114 may be epitaxial (single-crystal), defective epitaxial, polycrystalline or amorphous. III-V semiconductor layer 114 may be doped or undoped. In some embodiments, III-V semiconductor layer 114 is doped to between $1E16/cm^3$ and $1E21/cm^3$.

In some embodiments, the thickness of the III-V semiconductor layer 114 is chosen to minimize NMOS contact resistance. The III-V semiconductor layer 114 may have a thickness of between about 1 and 50 nanometers to accomplish this in some embodiments. Other thicknesses of the III-V semiconductor layer 114 may also be used. The formation of III-V semiconductor layer 114 may be in a selective manner on source region 106 and drain region 108 or in a blanket manner within trenches 112. Thus, depending on the formation process used, further processing steps may be required to remove III-V semiconductor layer 114 from the sides of trenches 112, the top of ILD 110 or top of gate 104, where it may be undesirable. III-V semiconductor layer 114 may be subjected to annealing or similar treatments, either before or after filling of trenches 112. Such annealing treatments could range from 300 C flash anneal to as high as 600 C for as long as one hour.

Figure 6:
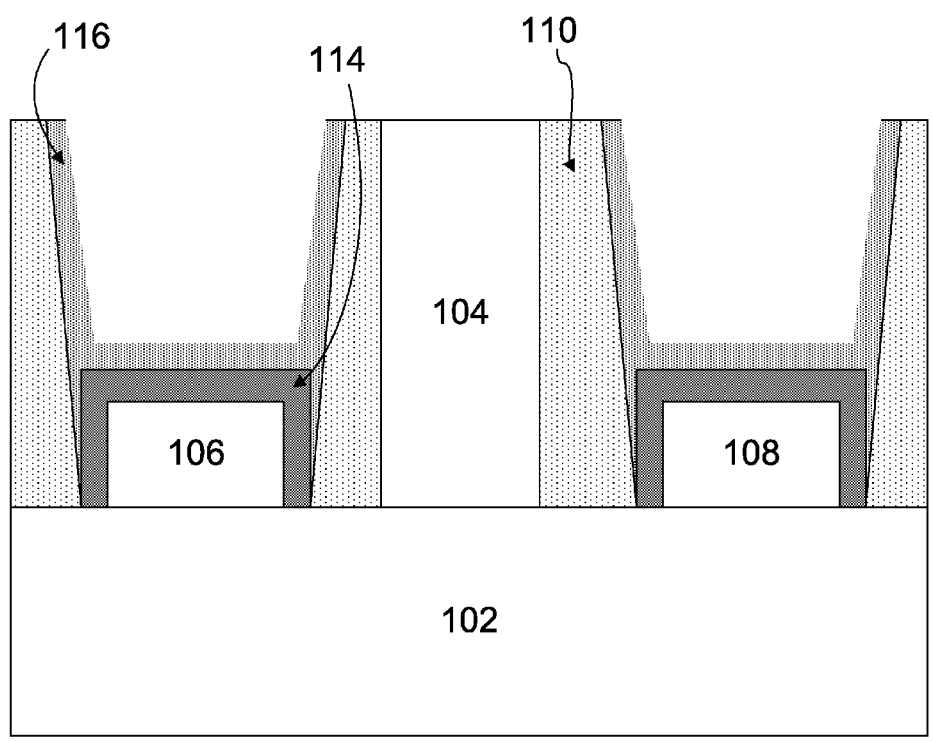
FIG. 6 is a cross sectional side view that illustrates the conductive layer deposited on the III-V semiconductor layer.
Figure 13:
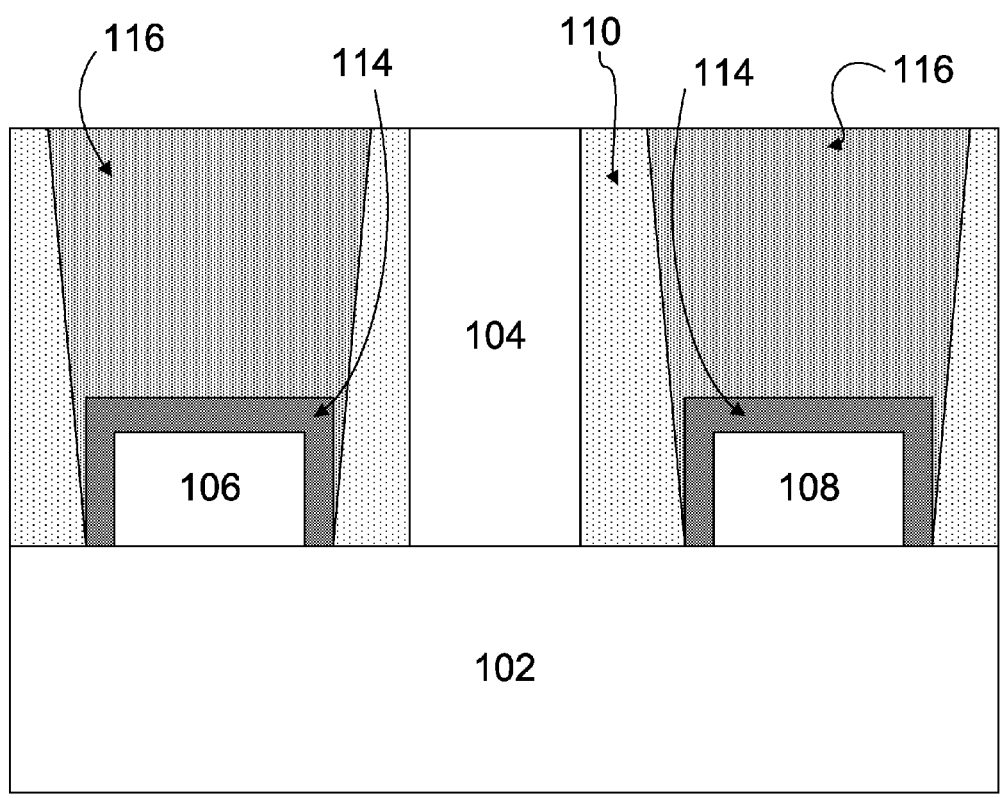
FIG. 13 is a cross sectional side view that illustrates an embodiment that lacks fill material.

Referring again to FIG. 2, a conductive layer 116 is deposited 208 on the III-V semiconductor layer 114. FIG. 6 is a cross sectional side view that illustrates the conductive layer 116 deposited 208 on the III-V semiconductor layer 114. The conductive layer 116 may be deposited 208 by a conformal deposition process such as chemical vapor deposition (CVD), atomic layer deposition (ALD), electroless plating, or another suitable deposition process. In some embodiments, such as embodiments where the conductive layer 116 is to fill the remaining volume of the trenches 112 (FIG. 13 is a cross sectional side view that illustrates such an embodiment) or the trenches 112 are large enough, nonconformal deposition techniques such as PVD may be used to deposit 208 the conductive layer.

The conductive layer 116 may be a metal or contain a metal in some embodiments. Various metals may be used. In some embodiments, the material of the conductive layer 116 may be chosen based on an appropriate workfunction for the type of transistor (high workfunction metal for a PMOS transistor, low workfunction metal for an NMOS transistor, with "high" workfunction being above about 5 eV and "low" workfunction being about 3.2 eV or lower), although this is not necessary. Materials used for the conductive layer 116 include aluminum, nickel, titanium, cobalt, magnesium, copper or other metals. Conductive metal carbides, nitrides or other materials may also be used for the conductive layer 116. Any suitable thickness may be used for the conductive layer 116. In some embodiments, the conductive layer 116 is greater than 100 Angstroms, with the conductive layer 116 being considerably thicker than 100 Angstroms in some embodiments.

In some embodiments, the gate 104 may be a sacrificial gate that is removed and a new gate formed after the first ILD layer 110 is deposited. In such an embodiment, the new gate may be formed with the same processes and at the same time as the conductive layer 114.

Figure 7:
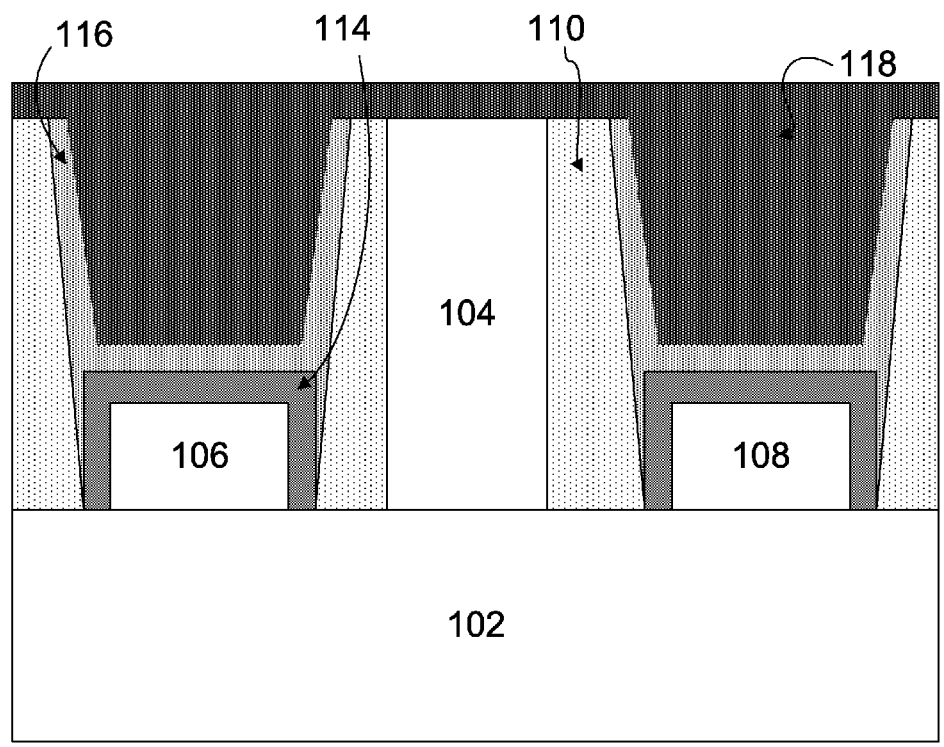
FIG. 7 is a cross sectional side view that illustrates the fill material.

Referring again to FIG. 2, the remaining volume of the trench 112 is filled 210. FIG. 7 is a cross sectional side view that illustrates the fill material 118. This fill material 118 may be a conductive material or any other suitable material, may be a single material or multiple materials, and may be deposited by any suitable method. As mentioned previously, in embodiments the conductive layer 116 may fill the trench. A separate fill material 118 is not used in such embodiments, as illustrated in FIG. 13.

Figure 8:
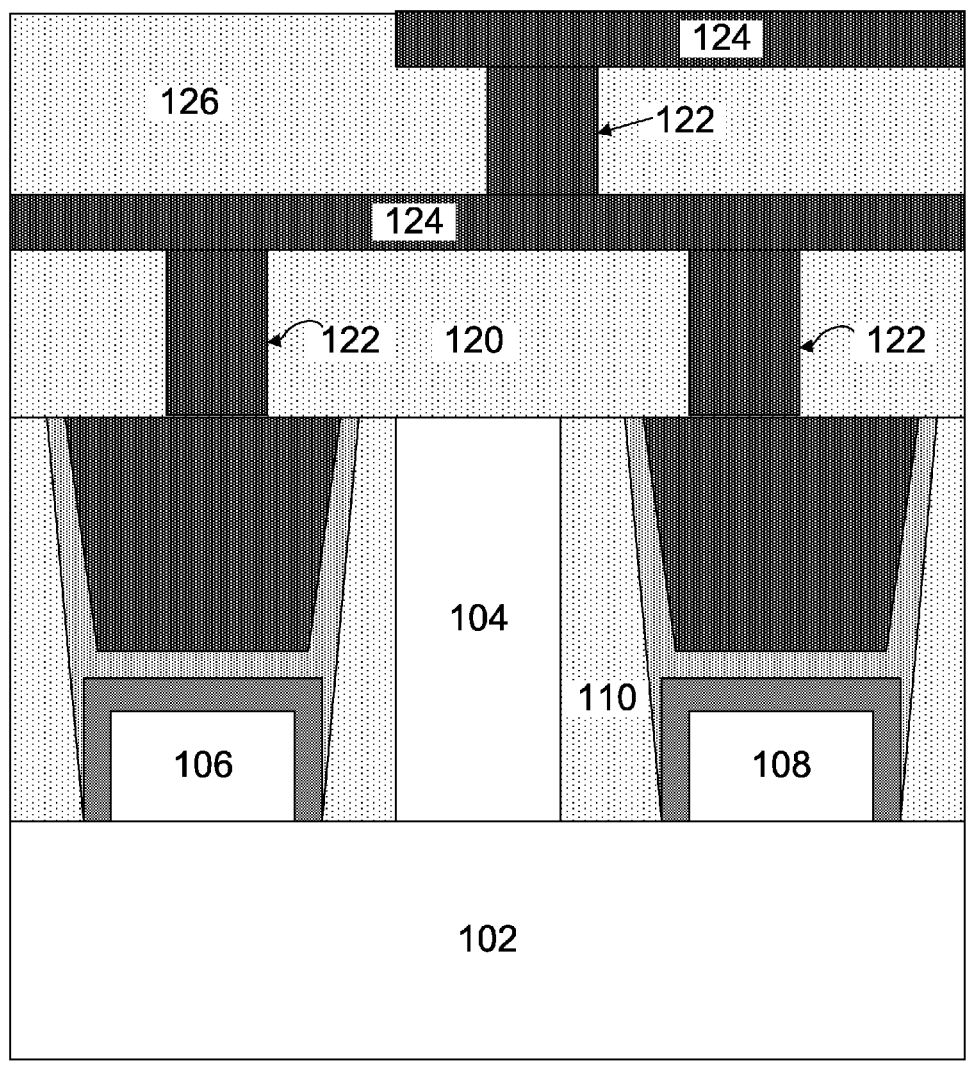
FIG. 8 is a cross sectional side view that illustrates additional ILD and conductive layers.

Referring back to FIG. 2, additional ILD and conductive layers may then be formed 212. FIG. 8 is a cross sectional side view that illustrates additional ILD and conductive layers. In FIG. 8, the III-V semiconductor layer 114, conductive layer 116, and fill material 118 were planarized to be substantially coplanar with a top surface of the first ILD layer 110. After planarization, the conductive layer 116 in the trench 112 to the source region 106 is not continuous with the conductive layer 116 in the trench 112 to the drain region 108. The conductive layer 116 may thus be considered to be a first conductive layer in the trench 112 on the left to the source region 106 and a second conductive layer in the trench on the right to the drain region 108.

A second ILD layer 120 has been deposited on the first ILD layer 110. Vias 122 and lines 124 in the second ILD layer 120 are conductively connected to the source and drain regions 106, 108 by the contacts in the trenches 112. A third ILD layer 126 has been deposited on the second ILD layer 120. Vias 122 and lines 124 in the third ILD layer 126 are conductively connected to the source and drain regions 106, 108 by the contacts in the trenches 112. Additional ILD layers and conductors may be present in other embodiments.

Figure 9:
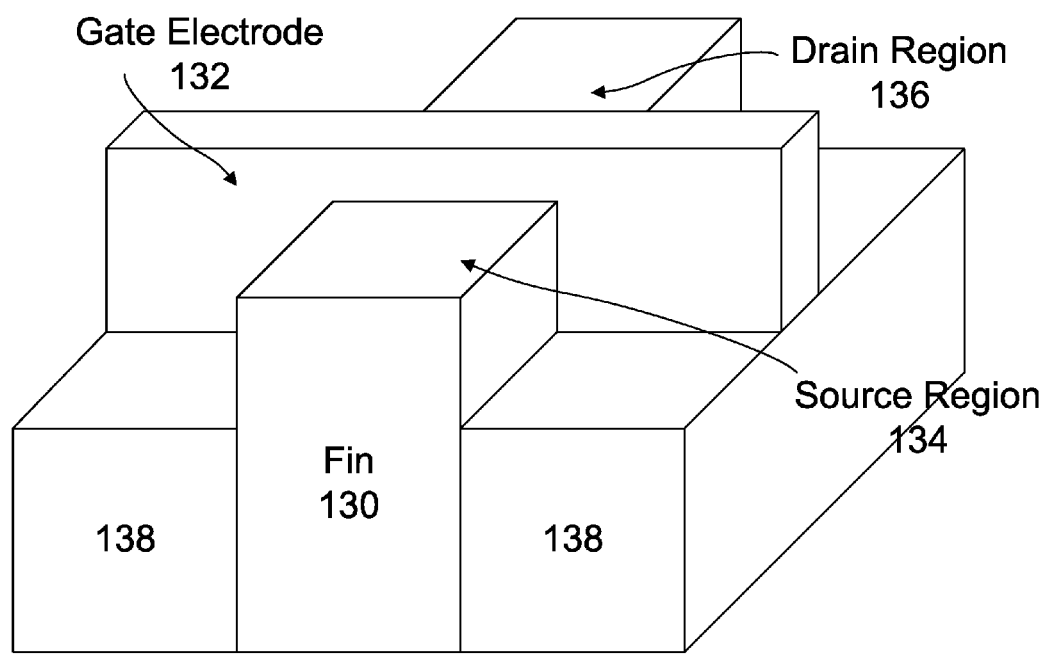
FIG. 9 is an isometric view that illustrates a multiple gate transistor.

FIG. 9 is an isometric view that illustrates a multiple gate transistor. The same conductor-on-semiconductor contact shown in FIGS. 1 and 3-8 may be used to other types of transistors as well, such as a trigate transistor. The trigate transistor illustrated in FIG. 9 includes a fin 130. There are isolation regions 138 on either side of the fin 130. There is a gate electrode 132 on the fin 130 adjacent the top and opposing side walls of the fin 130. On one side of the gate electrode 132 is a source region 134 and on another side of the gate electrode 132 is a drain region. Note that while FIG. 9 only has arrows pointing to the top surface of the fin 132 for the source and drain regions 134, 136, the source and drain regions 134, 136 may extend along the top surface and side walls of the fin 130.

Figure 10:
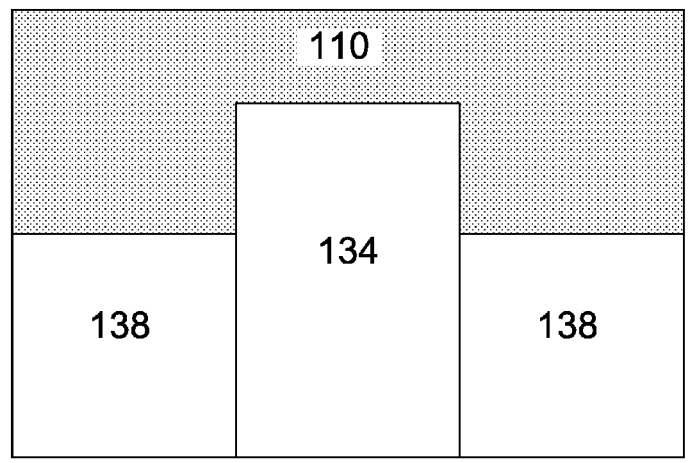
FIG. 10 is a cross sectional side view cut through the source region portion of the fin, and that illustrates the first ILD layer.
Figure 11:
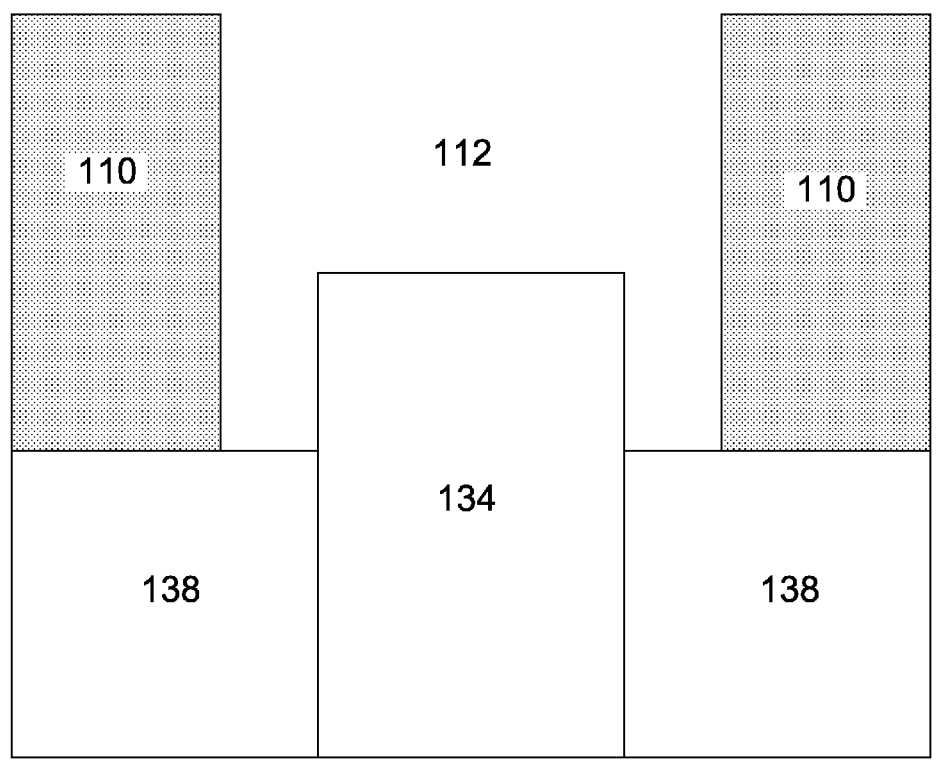
FIG. 11 is a cross sectional side view that illustrates a trench formed in the first ILD layer.

FIG. 10 is a cross sectional side view cut through the source region 134 portion of the fin 130, and that illustrates the first ILD layer 110 formed similarly to how a first ILD layer 110 may be formed on a planar transistor as shown in FIG. 3. FIG. 11 is a cross sectional side view that illustrates a trench 112 formed in the first ILD layer 110. The source region 134 is exposed by this trench 112.

Figure 12:
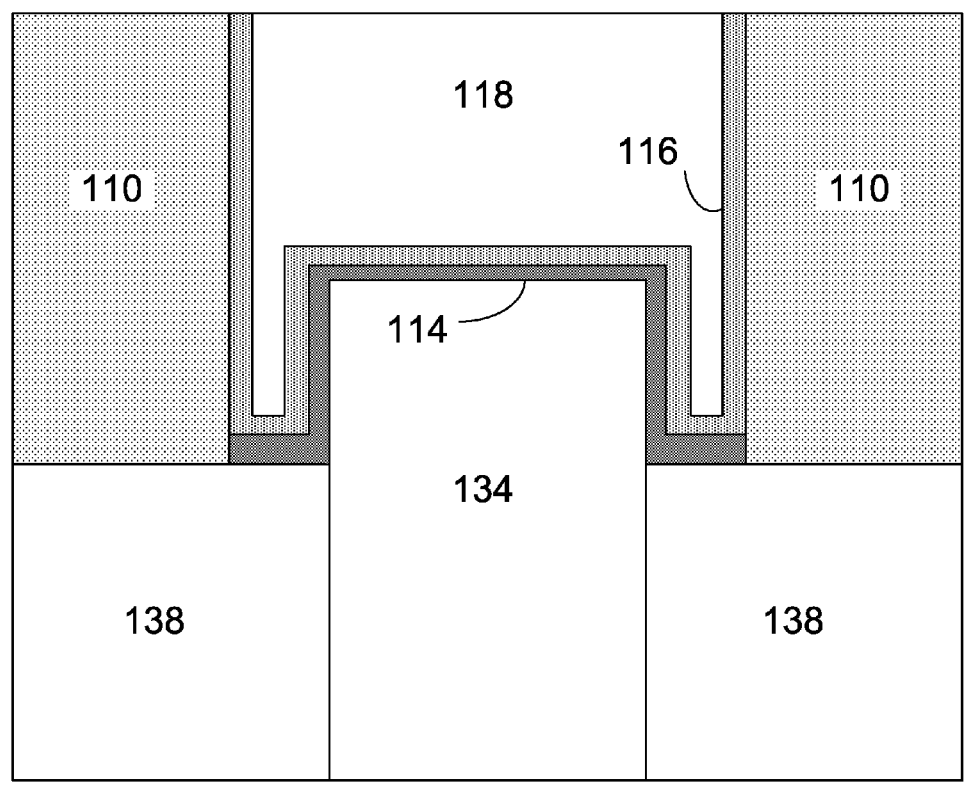
FIG. 12 is a cross sectional side view that illustrates the III-V semiconductor layer formed on the top surface and side walls of the source region of the fin, the conductive layer 116 formed on the III-V semiconductor layer, and the fill material that substantially fills the remaining volume of the trench.

FIG. 12 is a cross sectional side view that illustrates the III-V semiconductor layer 114 formed on the top surface and side walls of the source region 134 of the fin 130, the conductive layer 116 formed on the III-V semiconductor layer 114, and the fill material 118 that substantially fills the remaining volume of the trench 112. These materials may be formed similarly as described above with respect to device 100. As with device 100, the III-V semiconductor layer 114 separates the conductive layer 116 from the source region 134, yet this may allow a lower resistance contact than if a conductor were in contact with the source region.

Figure 14:
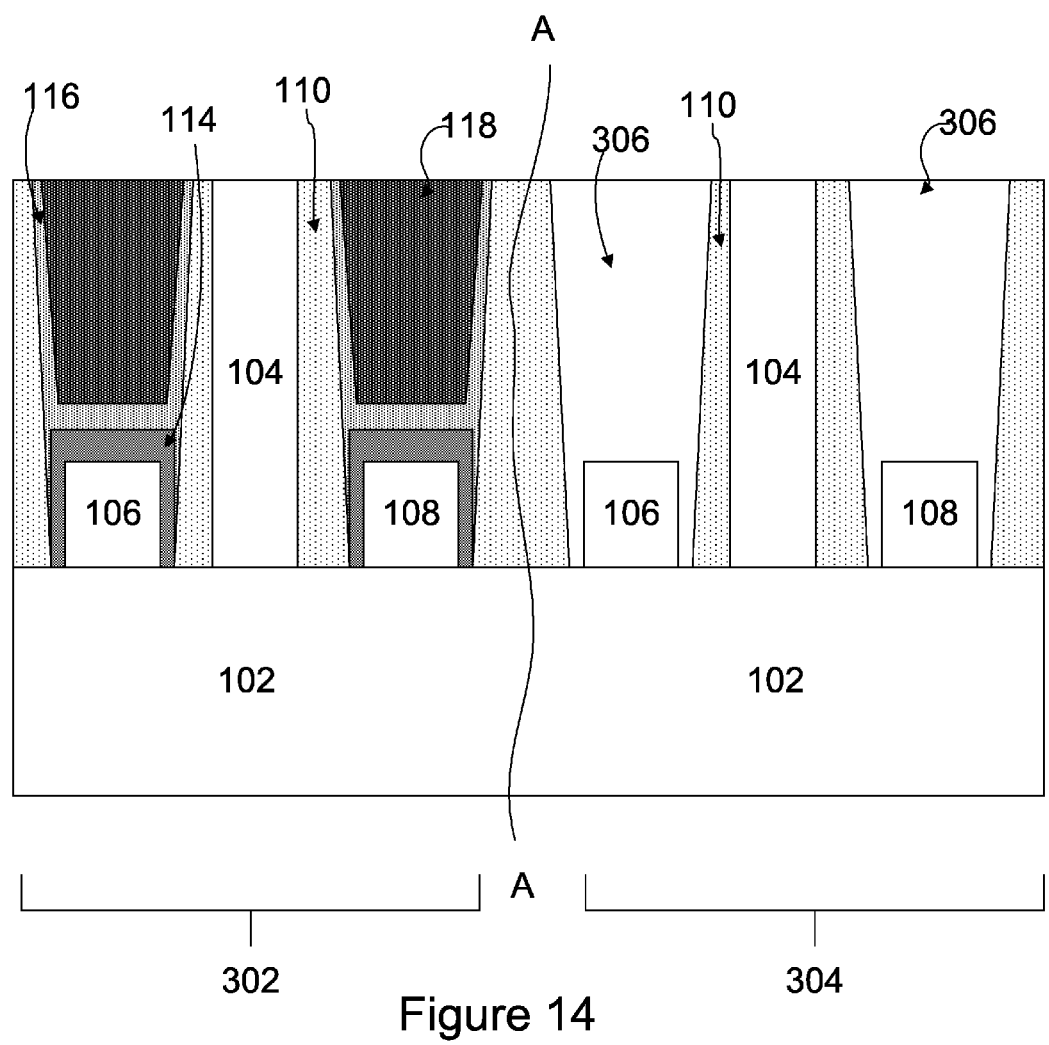
FIG. 14 is a cross sectional side view that illustrates a first transistor and a second transistor on the same substrate.

FIG. 14 is a cross sectional side view that illustrates a first transistor 302 and a second transistor 304 on the same substrate 102. Transistor 304 has contacts 306 that comprise a silicide, germanide, or the like, or otherwise has a conductor in contact with the source and drain regions 106, 108. The curved line A-A indicates that the transistors 302, 304 may be separated from each other rather than be right next to each other. In some embodiments, some transistors on a substrate 102, such as transistor 302, may include the contacts with the conductor 116 separated from the source and/or drain regions 106, 108 by an III-V semiconductor layer 114, while other transistors on the same substrate, such as transistor 304, may include contacts 306 formed of a silicide, germanide or other material with a conductor in contact with the source and/or drain regions 106, 108. For example, transistor 302 with contacts having a conductor 116 separated from the source and drain regions 106, 108 by an insulator 114 may be an NMOS transistor while transistor 304 may be a PMOS transistor, which may not benefit from the teachings of the present invention. All transistors of one type (N- or P-type) on a substrate may have one type of contact while all transistors of the opposite type may have another type of contact in an embodiment. In an alternative embodiment, some selected N-type transistors may have contacts with the conductor 116 separated from the source and/or drain regions 106, 108 by an III-V semiconductor layer 114, while the rest of the transistors may have more traditional contacts 306. In yet other embodiments, all transistors on a substrate 102 may have contacts with the conductor 116 separated from the source and/or drain regions 106, 108 by an III-V semiconductor layer 114. In yet another embodiment, some or all of transistors of one type may have insulating, conducting and (if applicable) fill layers 114, 116, 118 that comprise different materials than the insulating, conducting and (if applicable) fill layers 114, 116, 118 of transistors of the other type. For example, N-type transistors may have a first set of materials that comprise the insulating, conducting and (if applicable) fill layers 114, 116, 118, and P-type transistors on the same substrate 102 may have a second different set of materials that comprise the insulating, conducting and (if applicable) fill layers 114, 116, 118.

Figure 15:
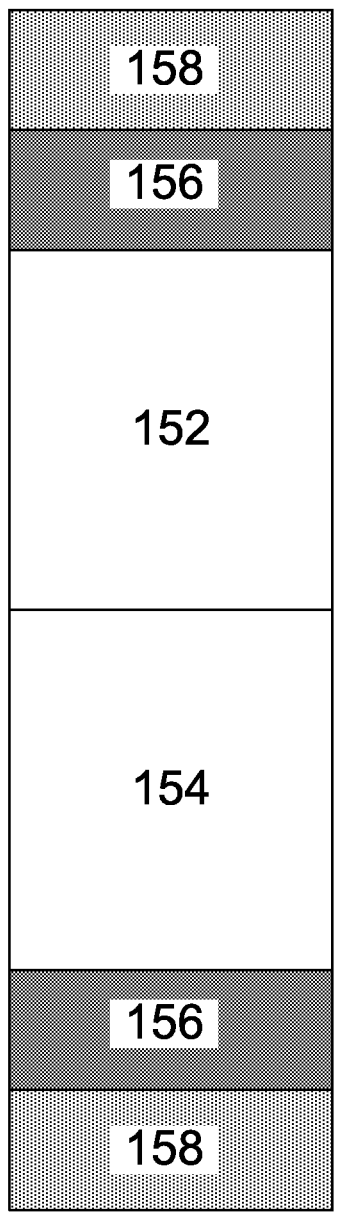
FIG. 15 is a cross sectional side view that illustrates a portion of a device having an electrical contact where the conductive contact material is separated by a III-V semiconductor layer from the region being contacted.

FIG. 15 is a cross sectional side view that illustrates a p-n junction 150 having an electrical contact where the conductive contact material 158 is separated by low bandgap III-V semiconductor layer 156 from n-type semiconductor 152 and p-type semiconductor 154. In an embodiment, p-n junction 150 is a portion of a semiconductor electronic device that may benefit from the teachings of the present invention. In various embodiments, p-n junction 150 may represent part of a diode, transistor, photo-detector, infrared detector, solar cell, LED, or any other integrated circuit or device that functions based upon the movement of electrons. N-type semiconductor 152 and P-type semiconductor 154 may be any type of semiconductor material, for example including, but not limited to, Group IV, Group III-V, Group II-VI, or Group IV-VI materials.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method to make a contact, comprising:
   depositing a dielectric layer on a substrate having a transistor;
   etching a first opening in the dielectric layer that extends to a source region;
   forming a III-V semiconductor layer on the source region;
   forming a contact metal on the III-V semiconductor layer, the III-V semiconductor layer separating the contact metal from the source region; and
   filling substantially all of the first opening, wherein the contact metal remains separated from the source region after the first opening is filled.

2. The method of claim 1, wherein the III-V semiconductor layer has a thickness of between about 1 and 50 nanometers.

3. The method of claim 1, wherein forming the III-V semiconductor layer comprises a technique chosen from the group consisting of: Metallorganic Vapor Phase Epitaxy (MOVPE), Metallorganic Chemical Vapor Deposition (MOCVD), Molecular Beam Epitaxy (MBE), Metallorganic Molecular Beam Epitaxy (MOMBE), Migration Enhanced Molecular Beam Epitaxy (MEE-MBE), Atomic Layer Epitaxy (ALE), Atomic Layer Deposition (ALD), and Physical Vapor Deposition (PVD).

4. The method of claim 1, wherein forming the III-V semiconductor layer comprises annealing.

5. The method of claim 1, wherein the transistor is a multigate transistor, wherein the III-V semiconductor layer is formed on a top and on side walls of a fin of the multigate transistor to result in an III-V semiconductor top and III-V semiconductor side walls, and wherein the contact metal is formed on the III-V semiconductor top and on the III-V semiconductor side walls.

6. A device, comprising:
   an n-type transistor with a source region and a drain region;
   a first interlayer dielectric layer adjacent the transistor;
   a trench through the first interlayer dielectric layer to the source region; and
   a conductive source contact in the trench, the source contact being separated from the source region by a III-V semiconductor interlayer.

7. The device of claim 6, wherein the transistor is a multigate transistor including a fin.

8. The device of claim 7, wherein the III-V semiconductor layer is on a top surface and side walls of the fin.

9. The device of claim 6, wherein the III-V semiconductor layer has a thickness of between about 1 and 50 nanometers.

10. The device of claim 6, further comprising:
    a second interlayer dielectric layer;
    a first metallization layer adjacent the second interlayer dielectric layer and having a plurality of conductive vias and a plurality of conductive lines;
    a third interlayer dielectric layer over the second interlayer dielectric layer;
    a second metallization layer adjacent the third interlayer dielectric layer and having a plurality of conductive vias and a plurality of conductive lines; and
    wherein at least some of the plurality of conductive vias and the plurality of conductive lines of the first metallization layer and at least some of the plurality of conductive vias and the plurality of conductive lines of the second metallization layer are conductively connected to the conductive source contact.

11. The device of claim 6, wherein the source region comprises a raised source formed on a substrate surface.

12. The device of claim 11, wherein the raised source comprises group IV material.

13. The device of claim 11, wherein the raised source comprises doped compounds.

14. The device of claim 6, wherein the III-V interlayer comprises compounds chosen from the group consisting of: InAs, InGaAs, InSb, GaSb, and GaInAsSbP.

15. The device of claim 6, wherein the III-V interlayer comprises doped compounds.

16. A device, comprising:
    a p-n junction with a p-type semiconductor region and a n-type semiconductor region, wherein the p-type semiconductor region comprises a raised source formed on a substrate surface; and
    a conductive contact, wherein the conductive contact is not directly adjacent the p-type semiconductor region, and wherein a III-V semiconductor layer separates the conductive contact from the p-type semiconductor region.

17. The device of claim 16, wherein the p-n junction comprises a portion of a device chosen from the group consisting of: diode, transistor, photo-detector, infrared detector, solar cell, and LED.

18. The device of claim 16, wherein the III-V semiconductor layer comprises a material chosen from the group consisting of: InAs, InGaAs, InSb, GaSb, and GaInAsSbP.

19. The device of claim 16, wherein the n-type semiconductor region comprises a material chosen from the group consisting of: Group IV, Group III-V, Group II-VI, and Group IV-VI material.

* * * * *